US012740209B2

(12) United States Patent
Chang et al.

(10) Patent No.: US 12,740,209 B2
(45) Date of Patent: Sep. 15, 2026

(54) SEMICONDUCTOR DEVICE AND SEMICONDUCTOR COMPONENT INCLUDING THE SAME

(71) Applicant: EPISTAR CORPORATION, Hsinchu (TW)

(72) Inventors: Yao-Ru Chang, Hsinchu (TW); Yi Hsiao, Hsinchu (TW); Sheng-Feng Kuo, Hsinchu (TW); Wei-Chu Liao, Hsinchu (TW); Shih-Chang Lee, Hsinchu (TW)

(73) Assignee: Ennostar Corporation, Hsinchu City (TW)

( * ) Notice: Subject to any disclaimer, the term of this patent is extended or adjusted under 35 U.S.C. 154(b) by 649 days.

(21) Appl. No.: 17/970,437

(22) Filed: Oct. 20, 2022

(65) Prior Publication Data

US 2023/0129560 A1 Apr. 27, 2023

(30) Foreign Application Priority Data

Oct. 26, 2021 (TW) ................................ 110139670

(51) Int. Cl.
*H10H 20/857* (2025.01)
*H10H 20/831* (2025.01)
*H10W 90/00* (2026.01)

(52) U.S. Cl.
CPC ...... *H10H 20/857* (2025.01); *H10H 20/8312* (2025.01)

(58) Field of Classification Search
CPC ............. H10H 20/857; H10H 20/8312; H10H 20/8316; H10H 20/84
See application file for complete search history.

(56) References Cited

U.S. PATENT DOCUMENTS

| | | | | |
|---|---|---|---|---|
| 7,594,333 B2 | 9/2009 | Chen | | |
| 8,040,463 B2 | 10/2011 | Kazama | | |
| 2014/0166102 A1* | 6/2014 | Bende | .................. | H10F 77/223 136/256 |
| 2015/0349220 A1* | 12/2015 | Moon | ................. | H10H 20/831 257/98 |
| 2019/0273184 A1* | 9/2019 | Wei | ...................... | H10H 20/831 |

FOREIGN PATENT DOCUMENTS

| | | |
|---|---|---|
| JP | 2012069684 | 4/2012 |

* cited by examiner

*Primary Examiner* — Monica D Harrison
*Assistant Examiner* — Jacob T Nelson
(74) *Attorney, Agent, or Firm* — Patterson + Sheridan, LLP

(57) ABSTRACT

A semiconductor device is provided, which includes an epitaxial structure, an electrode pad, and a contact region. The epitaxial structure includes a geometric center, a first surface and a second surface opposite to the first surface. The electrode pad is on the first surface. The contact region is on the second surface and includes a first group and a second group. The first group includes a plurality of first contact portions separated from each other and is arranged in a first ring shape. The second group includes a plurality of second contact portions separated from each other and is arranged in a second ring shape. A second distance between each of the plurality of second contact portions and the geometric center is greater than a first distance between each of the plurality of first contact portions and the geometric center.

20 Claims, 6 Drawing Sheets

SEMICONDUCTOR DEVICE AND SEMICONDUCTOR COMPONENT INCLUDING THE SAME

CROSS REFERENCE TO RELATED APPLICATIONS

This application claims the right of priority based on TW application Serial No. 110139670, filed on Oct. 26, 2021, which is incorporated by reference herein in their entirety.

FIELD OF DISCLOSURE

The present disclosure relates to a semiconductor device, in particular, to a semiconductor light-emitting device such as a light-emitting diode (LED).

BACKGROUND OF THE DISCLOSURE

Semiconductor devices are widely used and related materials are currently under development and research. For example, a group III-V semiconductor material containing a group III element and a group V element may be applied to various optoelectronic devices, such as light emitting diodes (LEDs), laser diodes (LDs), photoelectric detectors, solar cells or power devices (such as switches or rectifiers). These optoelectronic devices can be applied in various fields, such as illumination, medical care, display, communication, sensing, or power supply system. In semiconductor light-emitting devices, LEDs have low energy consumption and long operating lifetime, thus are widely used.

SUMMARY OF THE DISCLOSURE

The present disclosure provides a semiconductor device. The semiconductor device includes an epitaxial structure, an electrode pad, and a contact region. The epitaxial structure includes a geometric center, a first surface and a second surface opposite to the first surface. The electrode pad is on the first surface. The contact region is on the second surface and includes a first group and a second group. The first group includes a plurality of first contact portions separated from each other and arranged in a first ring shape. The second group includes a plurality of second contact portions separated from each other and arranged in a second ring shape. A second distance between each of the plurality of second contact portions and the geometric center is greater than a first distance between each of the plurality of first contact portions and the geometric center.

DETAILED DESCRIPTION OF THE DISCLOSURE

Figure 1:
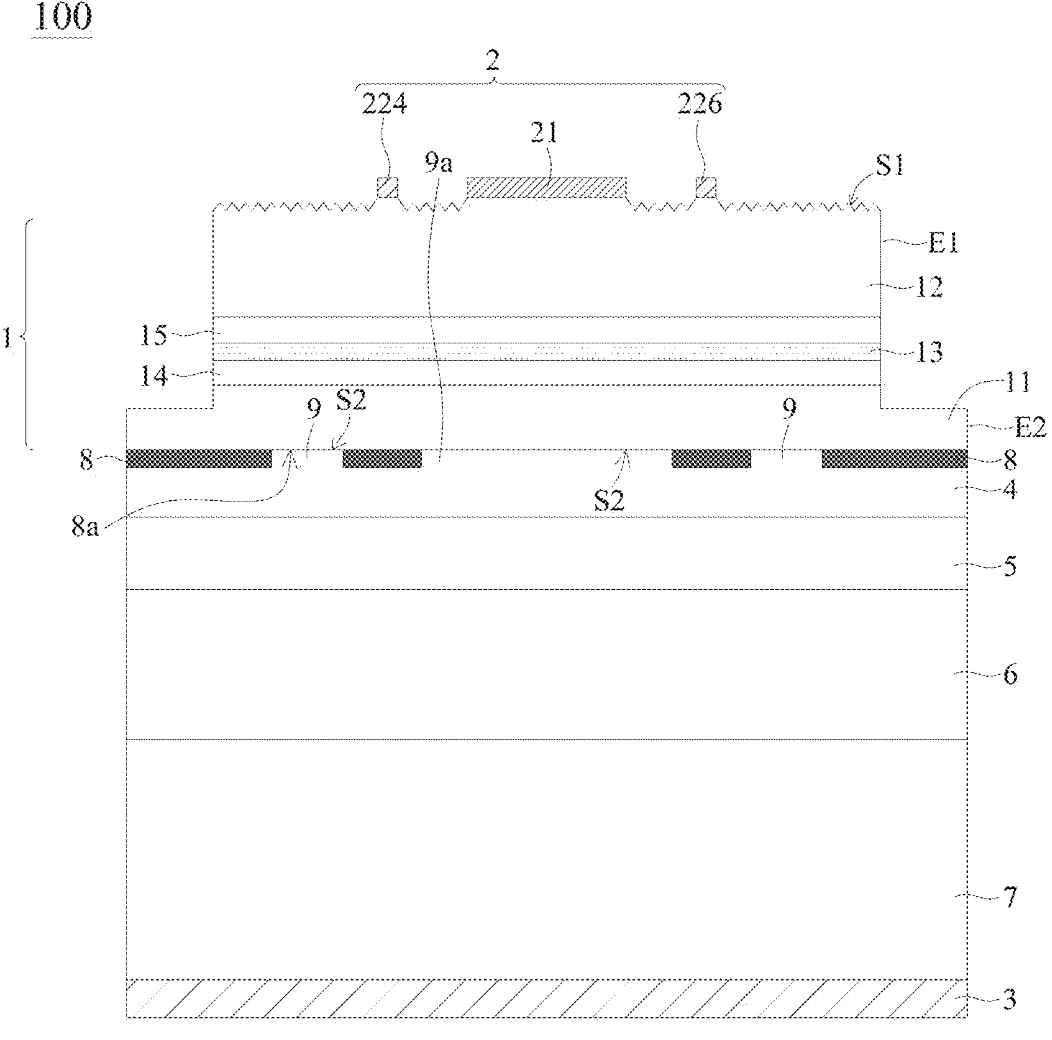
FIG. 1 shows a schematic sectional view of a semiconductor device in accordance with an embodiment of the present disclosure.

The following embodiments will be described with accompany drawings to disclose the concept of the present disclosure. In the drawings or description, same or similar portions are indicated with same or similar numerals. Furthermore, a shape or a size of a member in the drawings may be enlarged or reduced. Particularly, it should be noted that a member which is not illustrated or described in drawings or description may be in a form that is known by a person skilled in the art.

In the present disclosure, if not otherwise specified, the general formula InGaP represents $In_{x0}Ga_{1-x0}P$, wherein 0<x0<1; the general formula AlInP represents $Al_{x1}In_{1-x1}P$, wherein 0<x1<1; the general formula AlGaInP represents $Al_{x2}Ga_{x3}In_{1-x2-x3}P$, wherein 0<x2<1 and 0<x3<1; the general formula InGaAsP represents $In_{x4}Ga_{1-x4}As_{x5}P_{1-x5}$, wherein 0<x4<1, 0<x5<1; the general formula AlGaInAs represents $Al_{x6}Ga_{x7}In_{1-x6-x7}As$, wherein 0<x6<1 and 0<x7<1; the general formula InGaNAs represents $In_{x8}Ga_{1-x8}N_{x9}As_{1-x9}$, wherein 0<x8<1 and 0<x9<1; the general formula InGaAs represents $In_{x10}Ga_{1-x10}As$, wherein 0<x10<1; the general formula AlGaAs represents $Al_{x11}Ga_{1-x11}As$, wherein 0<x11<1. The content of each element may be adjusted for different purposes. For example, for adjusting the energy gap, or the peak wavelength or dominant wavelength when the semiconductor device is a light-emitting device.

With respect to the semiconductor device of the present disclosure, it can be a light-emitting device (such as a light-emitting diode or a laser diode), a light absorbing device (such as a photo-detector or a solar cell) or a non-optoelectronic device. Analysis of the composition and/or dopant contained in each layer of the semiconductor device of the present disclosure may be conducted by any suitable method, such as a secondary ion mass spectrometer (SIMS). A thickness of each layer may be obtained by any suitable method, such as a transmission electron microscopy (TEM) or a scanning electron microscope (SEM).

A person skilled in the art can realize that addition of other components based on a structure recited in the following embodiments is allowable. For example, if not otherwise specified, a description similar to "a first layer/structure is on or under a second layer/structure" may include an embodiment in which the first layer/structure directly (or physically) contacts the second layer/structure, and may also include an embodiment in which another structure is provided between the first layer/structure and the second layer/structure, such that the first layer/structure and the second layer/structure do not physically contact each other. In addition, it should be realized that a positional relationship of a layer/structure may be altered when being observed in different orientations.

Furthermore, in the present disclosure, a description of "a layer/structure substantially composed of M material" means the M material is the main constituent of the layer/structure; however, the layer/structure may still contain a dopant or unavoidable impurities.

Figure 2A:
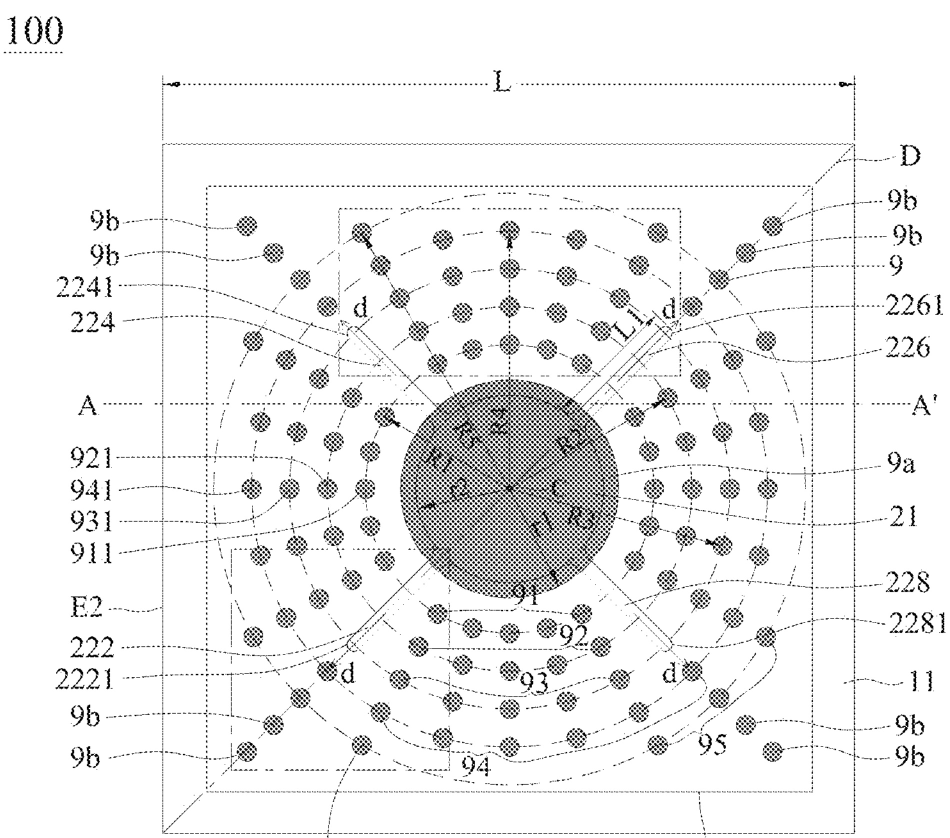
FIG. 2A shows a schematic top view of a semiconductor device in accordance with an embodiment of the present disclosure.
Figure 2B:
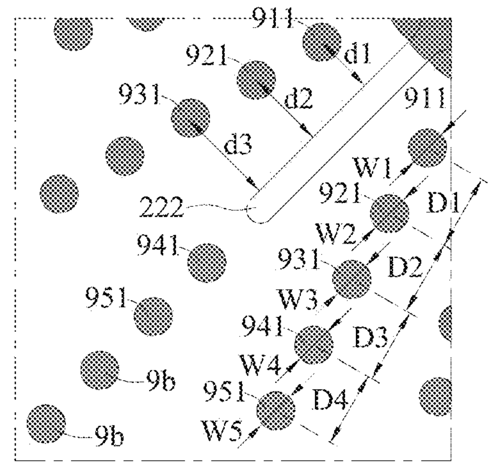
FIG. 2B shows an enlarged view of the dashed-line frame in the lower left part of FIG. 2A.
Figure 2C:
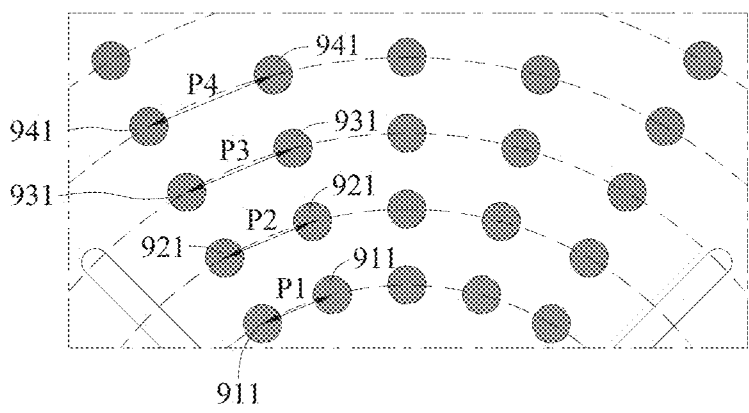
FIG. 2C shows an enlarged view of the dashed-line frame in the upper part of FIG. 2A.

FIG. 1 shows a schematic sectional view of a semiconductor device 100 in accordance with an embodiment of the present disclosure. FIG. 2A shows a schematic top view of a semiconductor device 100 in accordance with an embodiment of the present disclosure. FIG. 2B shows an enlarged view of the dashed-line frame in the lower left part of FIG. 2A. FIG. 2C shows an enlarged view of the dashed-line frame in the upper part of FIG. 2A.

As shown in FIG. 1, the semiconductor device 100 includes an epitaxial structure 1. The semiconductor device 100 further includes a first electrode 2 and a second electrode 3 located on the upper and lower sides of the epitaxial structure 1, respectively, and includes a contact region 9 located between the epitaxial structure 1 and the second electrode 3. The semiconductor device 100 may optionally include a conductive layer 4, a reflective structure 5, a bonding structure 6, a base 7 and an insulating portion 8. The conductive layer 4 is located between the epitaxial structure 1 and the reflective structure 5. The bonding structure 6 is located between the base 7 and the reflective structure 5. The insulating portion 8 is located between the epitaxial structure 1 and the conductive layer 4.

As shown in FIGS. 1 and 2A, the epitaxial structure 1 includes a first surface S1 and a second surface S2 opposite to the first surface S1. From a top view, the epitaxial structure 1 has a geometric center C. The geometric center C is a structural center. For example, when the epitaxial structure 1 has a circular shape in the top view, the geometric center C is the center of the circle, and when the epitaxial structure 1 has a square shape in the top view, the geometric center C is the center of gravity of the square. The first electrode 2 is located on the first surface S1 and includes an electrode pad 21. In this embodiment, the electrode pad 21 has a circular shape, and the circle center of the electrode pad 21 is the geometric center C. Optionally, the first electrode 2 further includes a plurality of extension electrodes 222, 224, 226 and 228 which is connected to the electrode pad 21. In the top view, the epitaxial structure 1 has a diagonal line with a length D, and each of the extension electrodes 222, 224, 226, and 228 extends from the electrode pad 21 along an extension direction d and has an extension length L1. The extension direction d is parallel to the diagonal line. The extension length L1 is less than a quarter of the length D, such as ⅕ to ¼, ⅙ to ¼, ⅛ to ¼, ⅒ to ⅙ of the length D, and each extension electrode 222, 224, 226, 228 has substantially the same extension length L1. In this embodiment, the semiconductor device 100 has a rectangular shape and has a side length L between 5 mil and 20 mil. The above-mentioned geometrical design of the first electrode 2 can be matched with the later-mentioned geometrical design of the contact region 9, so that a better performance in luminance can be obtained in the semiconductor device 100.

As shown in FIGS. 1 and 2A, the contact region 9 and the insulating portion 8 are located on the second surface S2 of the epitaxial structure 1. The contact region 9 has a first group 91 and a second group 92. The first group 91 and the second group 92 surrounds the electrode pad 21, and the first group 91 is closer to the electrode pad 21 than the second group 92. The first group 91 includes a plurality of first contact portions 911 separated from each other. The plurality of the first contact portions 911 is arranged in a ring shape. The second group 92 includes a plurality of second contact portions 921 separated from each other. The plurality of the second contact portions 921 is also arranged in a ring shape. From the top view of the semiconductor device 100, each of the first contact portions 911 and the geometric center C have approximately the same first distance R1, and each of the second contact portions 921 and the geometric center C have approximately the same second distance R2. The second distance R2 is greater than the first distance R1. In this embodiment, the shapes of the first contact portions 911 and the second contact portions 921 are circular in the top view, and the first distance R1 is the distance from a circle center of the first contact portion 911 to the geometric center C. Similarly, the second distance R2 is the distance from a circle center of the second contact portion 921 to the geometric center C. In other words, on the second surface S2, the first group 91 and the second group 92 of the contact region 9 are arranged in concentric circles with the center at the geometric center C so that the semiconductor device 100 can achieve a better current distribution and an improved luminous efficiency.

In this embodiment, the farther the contact region 9 is from the geometric center C, the greater the minimum distance between the contact region and the extension electrode. Specifically, as shown in FIG. 2B, there are a first minimum distance d1 between the first contact portion 911 adjacent to the extension electrode 222 and the extension electrode 222, and a second minimum distance d2 between the second contact portion 921 adjacent to the extension electrode 222 and the extension electrode 222. The second minimum distance d2 is greater than the first minimum distance d1. As shown in FIG. 2A, the contact region 9 of the present embodiment further includes a contact portion 9*a* that is located approximately under and corresponds to the electrode pad 21, the contact portion 9*a* has a circular shape and has a radius r1 greater than the radius r2 of the circular electrode pad 21, and the contact portion 9*a* is located under a portion of the extension electrodes 222, 224, 226, and 228. In another embodiment, the contact portion 9*a* may be omitted, that is, the contact region 9 and the electrode pad 21 do not overlap in a vertical direction. In this embodiment, the contact region 9 does not overlap with the extension electrodes 222, 224, 226, and 228 in the vertical direction. In an embodiment, the minimum distance between the first contact portion 911 and the electrode pad 21 or the extension electrodes 222, 224, 226, 228 is at least 10 μm, for example, 10 μm to 50 μm, 15 μm to 40 μm, or 20 μm to 30 μm. In an embodiment, the minimum distance between the second contact portion 921 and the electrode pad 21 or the extension electrodes 222, 224, 226, 228 is at least 10 μm, for example, 10 μm to 50 μm, 15 μm to 40 μm, or 20 μm to 30 μm. In another embodiment, the epitaxial structure 1 has a first edge E1 and a second edge E2, the second edge E2 surrounds the first edge E1, and the contact region 9 closest to the first edge E1 is separated from the first edge E1 by a distance greater than 5 μm, such as 5 μm to 30 μm, 10 μm to 25 μm, or 15 μm to 20 μm. Through the design of these distances between the contact region 9 and the first electrode 2 and/or the contact region 9 and the first edge E1, the risk of electrical failure can be reduced and the uniformity of current distribution can be improved.

The contact region 9 may optionally include a third group 93, a fourth group 94 and a fifth group 95. The third group 93 includes a plurality of third contact portions 931 separated from each other. The plurality of the third contact portions 931 is arranged in a ring shape. The fourth group 94 includes a plurality of fourth contact portions 941 separated from each other. The plurality of the fourth contact portions 941 is arranged in a ring shape. The fifth group 95 includes a plurality of fifth contact portions 951 separated from each other. The plurality of the fifth contact portions 951 is arranged in a ring shape. From the top view of the semiconductor device 100, each of the third contact portions 931 and the geometric center C have approximately the same third distance R3, each of the fourth contact portions 941 and the geometric center C have approximately the same fourth distance R4, and each of the fifth contact portions 951 and the geometric center C have approximately the same fifth distance R5. The third distance R3 is greater than the second distance R2, the fourth distance R4 is greater than the third distance R3, and the fifth distance R5 is greater than the fourth distance R4. The third contact portion 931, the fourth contact portion 941 and the fifth contact portion 951 have circular shapes in the top view. The third distance R3 is the distance from the circle center of the third contact portion 931 to the geometric center C, the fourth distance R4 is the distance from the circle center of the fourth contact portion 941 to the geometric center C, and the fifth distance R5 is the distance from the circle center of the fifth contact portion 951 to the geometric center C. In other words, on the second surface S2, the third group 93, the fourth group 94 and the fifth group 95 of the contact region 9 are arranged in concentric circles with the center at the geometric center C, so that the semiconductor device 100 can achieve a better current distribution. Similarly, the third contact portion 931 adjacent to the extension electrode 222 is separated from the extension electrode 222 by a third minimum distance d3. The third minimum distance d3 is greater than the second minimum distance d2.

According to the size of the semiconductor device 100, the contact region 9 may optionally include a sixth group, a seventh group, etc., so as to achieve higher efficiency in current distribution. The number of the first contact portions 911, the second contact portions 921, the third contact portions 931, the fourth contact portions 941 and/or the fifth contact portions 951 may be greater than five (such as six, eight, ten, twelve, . . . ) and may distributed on the second surface S2, thereby a current injected into the semiconductor device 100 can be uniformly distributed in the semiconductor device. In this embodiment, along a direction away from the geometric center C, the number of contact portions increases first and then decreases. For example, the number of the fourth contact portions 941 (24) is larger than the numbers of the first contact portions 911 (20), the second contact portions 921 (20) and the third contact portions 931 (20). However, the number of the fifth contact portions 951 (12) is less than the numbers of the first contact portions 911, the second contact portions 921, the third contact portions 931 and the fourth contact portions 941, thereby the current can be uniformly distributed in every region of the epitaxial structure 1. In another embodiment, the numbers of the first contact portions 911, the second contact portions 921, the third contact portions 931, the fourth contact portions 941 and/or the fifth contact portions 951 are the same. In another embodiment, the number of contact portions increases along the direction away from the geometric center C. In another embodiment, the number of contact portions decreases along the direction away from the geometric center C.

In this embodiment, a part of the fourth contact portions 941 and a part of the fifth contact portions 951 are located on a diagonal line and are arranged along the extension direction d of each of the extending electrodes 222, 224, 226, and 228. The contact region 9 may optionally include a plurality of outer contact portions 9*b* farther from the geometric center C than the fifth contact portions 951. The plurality of outer contact portions 9*b* are located on the diagonal line and arranged along the extension direction d. In this embodiment, the extension electrodes 222, 224, 226, and 228 each have end portions 2221, 2241, 2261, and 2281 that are away from the geometric center C, and each of the end portions 2221, 2241, 2261, and 2281 are located between the third group 93 and the fourth group 93. In other words, R3<L1+r2<R4, wherein L1 is the extension length of the extension electrodes 222, 224, 226, 228, r2 is the radius of the electrode pad 21, R3 is the distance between the circle center of the third contact portion 931 and the geometric center C, and R4 is the distance between the circle center of the fourth contact portion 941 and the geometric center C. For example, in order to improve the overall efficiency in current distribution of the semiconductor device 100, the radius r2 and the side length L of the electrode pad 21 and/or the extension length L1 of the extension electrodes 222, 224, 226, 228 and the side length L can be designed to meet the following relationships: 5%≤((r2/L)×100%)≤20 and/or 1.5%≤((L1/L)×100%)≤30%.

As shown in FIG. 2B, each of the first contact portions 911 has a first width W1, each of the second contact portions 921 has a second width W2, each of the third contact portions 931 has a third width W3, each of the fourth contact portions 941 has a fourth width W4, and each of the fifth contact portions 951 has a fifth width W5. As mentioned above, the shapes of the first contact portions 911, the second contact portions 921, the third contact portions 931, the fourth contact portions 941 and the fifth contact portions 951 are circular, so the first width W1, the second width W2, the third width W3, the fourth width W4 and the fifth width W5 are the diameters of the circles. In this embodiment, the first width W1, the second width W2, the third width W3, the fourth width W4 and the fifth width W5 are approximately equal. In an embodiment, W1<W2<W3<W4<W5. In another embodiment, W1>W2>W3>W4>W5. In another embodiment, the contact portions 911, 921, 931, 941 or 951 that are closer to the electrode pad 21 have smaller widths, and the contact portions 921, 931, 941 or 951 that are away from the electrode pad 21 has a larger width. The plurality of first contact portions 911 may respectively have different widths. Similarly, the plurality of second contact portions 921, the third contact portions 931, the fourth contact portions 941 or the fifth contact portions 951 may respectively have different widths to match the design of the first electrode 2 for achieving a better current distribution and luminance.

In this embodiment, in two adjacent groups, the distances between the contact portions may be the same, or may gradually increase or decrease from the geometric center C to the first edge E1 and the second edge E2. Specifically, for the contact portions which are in different groups and arranged in the same direction, the distances between two adjacent contact portions may be the same, or may gradually increase or decrease from the geometric center C to the first edge E1 and the second edge E2. Alternatively, two adjacent contact portions are separated by a distance in each group, and the distances between two adjacent contact portions in different groups may be the same, or may gradually increase from the geometric center C to the first edge E1 and the second edge E2. An example is shown below.

As shown in FIG. 2B, the first group 91, the second group 92, the third group 93, the fourth group 94, and the fifth group 95 in this embodiment are equally spaced. For example, there is a first pitch D1 between any one of the second contact portions 921 and an adjacent first contact portion 911, and a second pitch D2 between the second contact portion 921 and an adjacent third contact portion 931 wherein the second pitch is equal to the first pitch D1, while the first contact portion 911, the second contact portion 921 and the third contact portion 931 are arranged in a line. There is a third pitch D3 between any one of the fourth contact portions 941 and an adjacent third contact portion 931, and a fourth pitch D4 between the fourth contact portion 941 and an adjacent fifth contact portion 951 wherein the fourth pitch D4 is equal to the third pitch D3, while the third contact portion 931, the fourth contact portion 941 and the fifth contact portion 951 are arranged in a line. In another embodiment, the distances between the first group 91, the second group 92, the third group 93, the fourth group 94, and the fifth group 95 can also gradually increase or decrease, such as D1>D2>D3>D4 or D1<D2<D3<D4.

As shown in FIG. 2C, in this embodiment, two adjacent first contact portions 911 in the first group 91 have a first interval P1, and two adjacent second contact portions 921 in the second group 92 have a second interval P2, two adjacent third contact portions 931 in the third group 93 have a third interval P3, and two adjacent fourth contact portions 941 in the fourth group 94 have a fourth interval P4 wherein P1<P2<P3<P4. In other embodiments, the intervals between two adjacent contact portions in the same group gradually decrease from the geometric center C to the first edge E1 and the second edge E2, such as P1>P2>P3>P4. In another embodiment, the intervals between two adjacent contact portions is equal, such as P1=P2=P3=P4.

Figure 3:
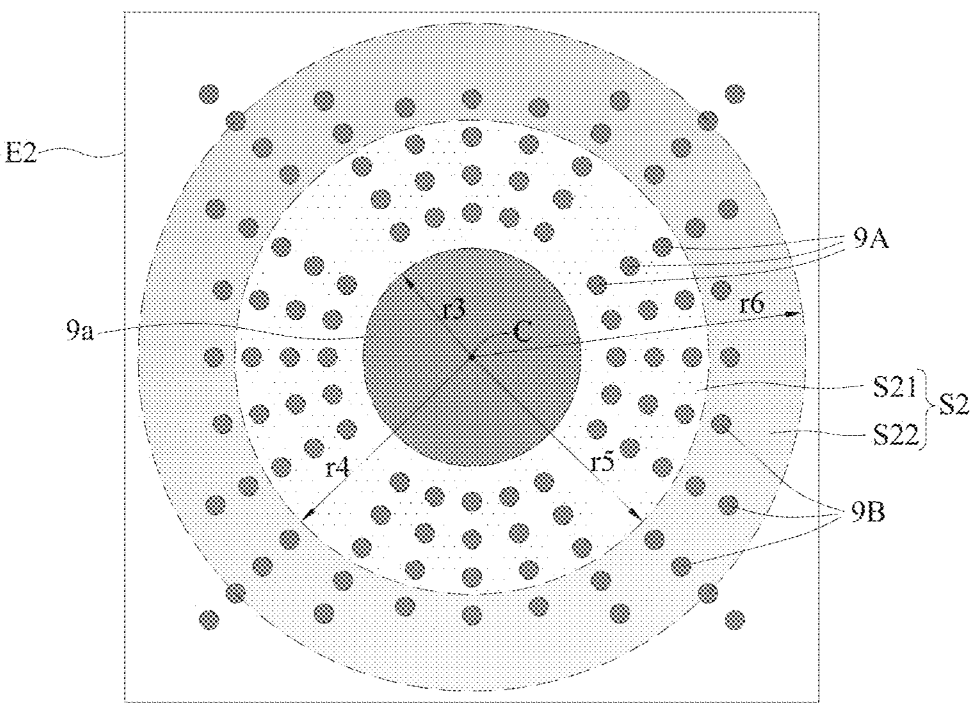
FIG. 3 shows a schematic top view of a contact region of the semiconductor device in accordance with an embodiment of the present disclosure.

FIG. 3 shows a schematic top view of a semiconductor device 100 in accordance with an embodiment of the present disclosure. For clarity of disclosure, only a part of layers is illustrated in this figure. The density of the contact region 9 is gradually decreased from the geometric center C of the epitaxial structure 1 toward the second edge E2. Through the design for the distribution of the contact region 9, the semiconductor device 100 can efficiently disperse the current to each region to improve luminance.

Specifically, the second surface S2 of the epitaxial structure 9 has a first region S21 and a second region S22, the second region S22 surrounds the first region S21, and the first region S21 is closer to the geometric center C than the second region S22. The contact region 9 has a first part 9A located in the first region S21 and having a first density, and a second part 9B located in the second region S22 and having a second density less than the first density. For example, the first region S21 has a first area A21, the second region S22 has a second area A22, the total area of the first part 9A is A9A, and the total area of the second part 9B is A9B, then the first density is A9A/A21, the second density is A9B/A22. In this embodiment, the first density is 7% to 50%, the second density is 1% to 7%, the first area A21 is less than the second area A22, and the second area A22 is 1.02 to 5 times of the first area A21.

The first region S21 and the second region S22 in this embodiment are both ring-shaped and are connected to each other. The first region S21 is a ring-shaped structure with a distance of 0.15 L to 0.3 L from the geometric center, and the second region S22 is a ring-shaped structure with a distance of 0.3 L to 0.45 L from the geometric center. Specifically, an inner diameter r3 of the first region S21 is 0.15 times of the side length L, and an outer diameter r4 of the first region S21 is 0.3 times of the side length L, an inner diameter r5 of the second region S22 is 0.3 times of the side length L, and an outer diameter r6 is 0.45 times of the side length L, and the outer diameter r4 of the first region S21 is equal to the inner diameter r5 of the second region S22. In other embodiments, the shapes of the first region S21 and the second region S22 may be annular, quadrilateral, etc., and the first region S21 and the second region S22 may be separated from each other and not directly connected. In this embodiment, the first region S21 and the electrode pad 21 do not overlap.

In this embodiment, the second surface S2 has a first surface area, and the side of the contact region 9 facing the second surface S2 has a second surface area, and the percentage ratio of the second surface area to the first surface area is 0.5% to 25%, such as 0.8% to 20%, 5% to 15%, or 8% to 13%.

Figure 4:
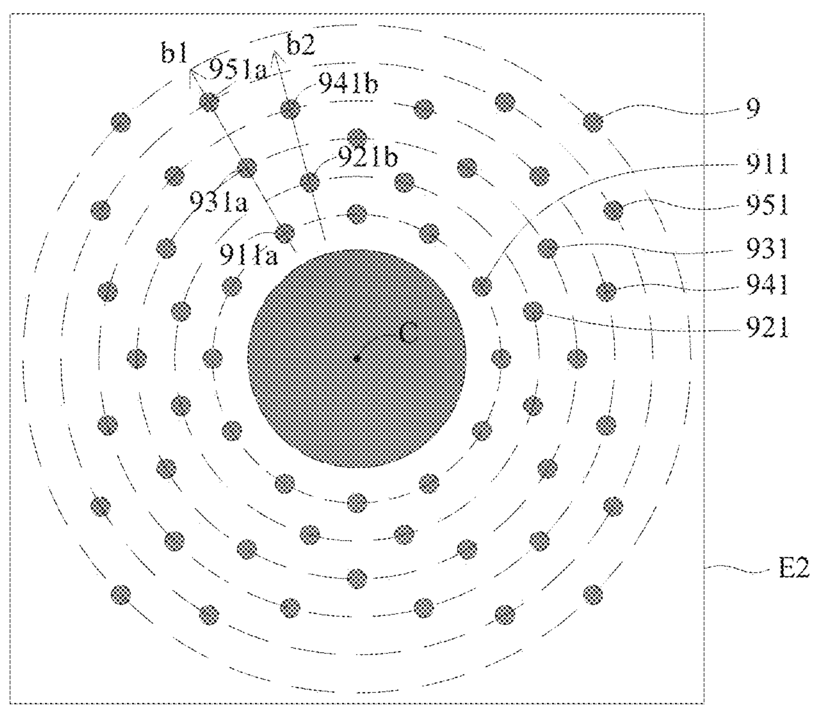
FIG. 4 shows a schematic top view of a contact region of the semiconductor device in accordance with an embodiment of the present disclosure.

FIG. 4 shows a schematic top view of a semiconductor device 200 in accordance with an embodiment of the present disclosure. For clarity of disclosure, only the contact region 9 and the second edge E2 of the epitaxial structure 1 are illustrated, regardless of the materials therein are non-transparent, transparent or translucent. In this embodiment, the first contact portions 911, the second contact portions 921, the third contact portions 931, the fourth contact portions 941 and the fifth contact portions 951 appear at intervals. For example, in a first direction b1, the contact region 9 only includes a first contact portion 911*a*, a third contact portion 931*a*, and a fifth contact portion 951*a*, and there is no any second contact portion 921 between the first contact portion 911*a* and the third contact portion 931*a*; in a second direction b2, the contact region 9 only includes a second contact portion 921*b* and a fourth contact portion 941*b*, and there is no any third contact portion 931 between the second contact portion 921*b* and the fourth contact portion 941*b*. The first direction b1 is defined as a direction along a line segment connecting a circle center of the first contact portion 911*a*, a circle center of the third contact portion 931*a* and a circle center of the fifth contact portion 951*a*, and the second direction b2 is defined as a direction along a line segment connecting a circle center of the second contact portion 921*a* and a circle center of the fourth contact portion 941*a*, and the second direction b2 is different from the first direction b1. As described above, in the semiconductor device 200 of the present embodiment, the first contact portion 911, the second contact portion 921, the third contact portion 931, the fourth contact portion 941 and the fifth contact portion 951 appear at intervals; therefore, among the contact portions arranged in the same direction (such as the first direction b1 or the second direction b2), the distance between two adjacent contact portions is greater than the distance between two adjacent contact portions of the semiconductor device 100 shown in FIGS. 2A to 2C.

Figure 5:
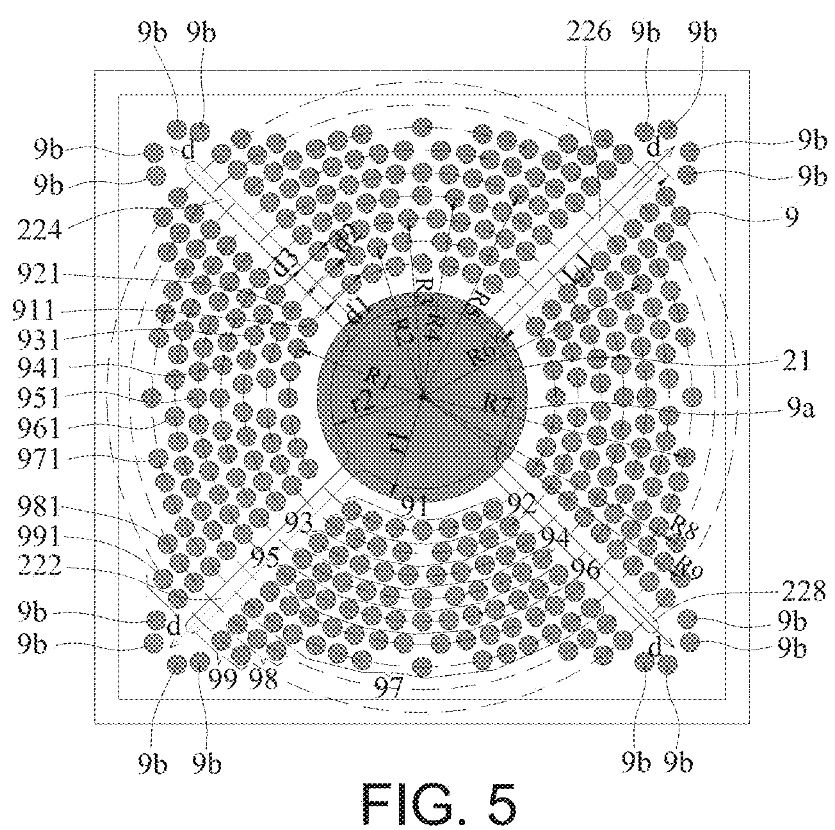
FIG. 5 shows a schematic top view of a semiconductor device in accordance with an embodiment of the present disclosure.

FIG. 5 shows a schematic top view of a semiconductor device 300 in accordance with an embodiment of the present disclosure. The semiconductor device 300 of this embodiment is similar to the semiconductor device 100 shown in FIG. 1, the main difference is that the contact region 9 of the semiconductor device 300 further includes a sixth group 96, a seventh group 97, an eighth group 98 and a ninth group 99. The sixth group 96 includes a plurality of sixth contact portions 961 separated from each other, and the plurality of the sixth contact portions 961 is arranged in a ring shape; the seventh group 97 includes a plurality of seventh contact portions 971 separated from each other, and the plurality of the seven contact portions 971 is arranged in a ring shape; the eighth group 98 includes a plurality of eighth contact portions 981 separated from each other, and the plurality of eighth contact portions 981 is arranged in a ring shape; the ninth group 99 includes a plurality of ninth contact portions 991 separated from each other, and the plurality of ninth contact portions 991 is arranged in a ring shape. From the top view of the semiconductor device 300, the distance (i.e., a sixth distance R6) between the circle center of each of the sixth contact portions 961 and the geometric center C is approximately the same, the distance (i.e., a seventh distance R7) between the circle center of each of the seventh contact portions 971 and the geometric center C is approximately the same, the distance (i.e., an eighth distance R8) between the circle center of each of the eighth contact portions 981 is approximately the same, and the distance (i.e., a ninth distance R9) between the circle center of each of the ninth contact portions 991 and the geometric center C is approximately the same. The sixth distance R6 is greater than the fifth distance R5, the seventh distance R7 is greater than the sixth distance R6, the eighth distance R8 is greater than the seventh distance R7, and the ninth distance R9 is greater than the eighth distance R8. The minimum distances between these contact portions and the extension electrode in this embodiment are maintained at a constant value, and do not change with the distances between the contact portions and the geometric center C. Specifically, there are a first minimum distance d1 between the first contact portion 911 adjacent to the extension electrode 222 and the extension electrode 222, a second minimum distance d2 between the second contact portion 921 adjacent to the extension electrode 222 and the extension electrode 222, and a third minimum distance d3 between the third contact portion 931 adjacent to the extension electrode 222 and the extension electrode 222, and the first minimum distance d1, the second minimum distance d2 and the third minimum distance d3 are approximately the same.

The contact region 9 of the semiconductor device 300 of the present embodiment further includes a plurality of outer contact portions **9*b* farther from the geometric center C than the ninth contact portions 991, and the plurality of the outer contact portions 9*b* surrounds the extension electrodes 222, 224, 226, 228, and is not located on the diagonal line. In this embodiment, the end portions 2221, 2241, 2261, and 2281 of the extension electrodes 222, 224, 226, and 228 are located between the ninth group 99 and the outer contact portions 9*b*. In other words, $L1+r2>R9$, wherein L1 is the extension lengths of the electrodes 222, 224, 226 and 228, r2 is the radius of the electrode pad 21, and R9 is the distance between the circle center of the ninth contact portion 991** and the geometric center C.

Figure 6:
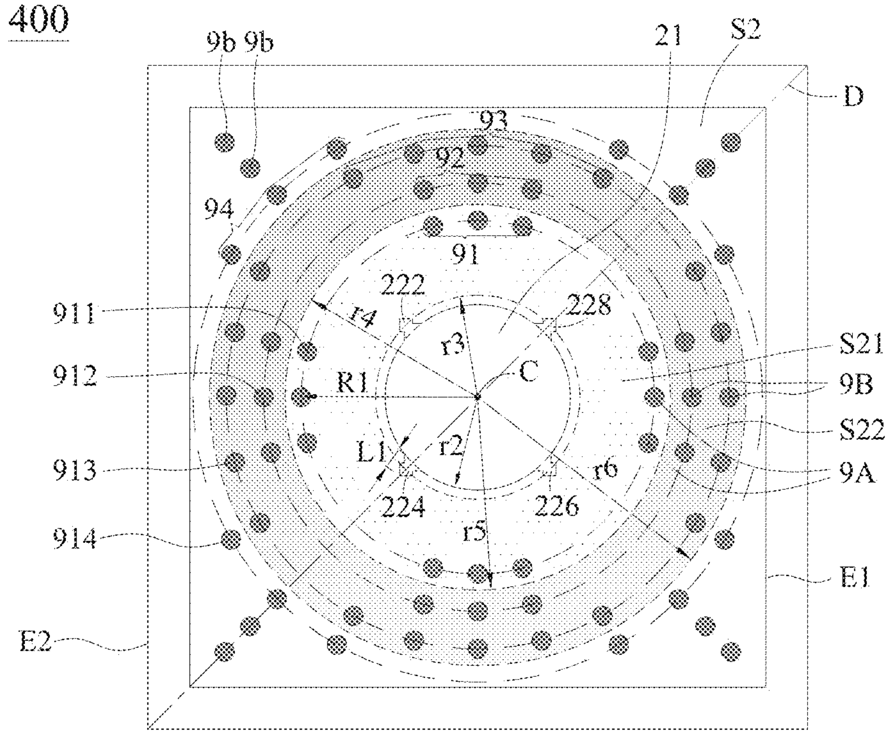
FIG. 6 shows a schematic top view of a semiconductor device in accordance with an embodiment of the present disclosure.
Figure 7:
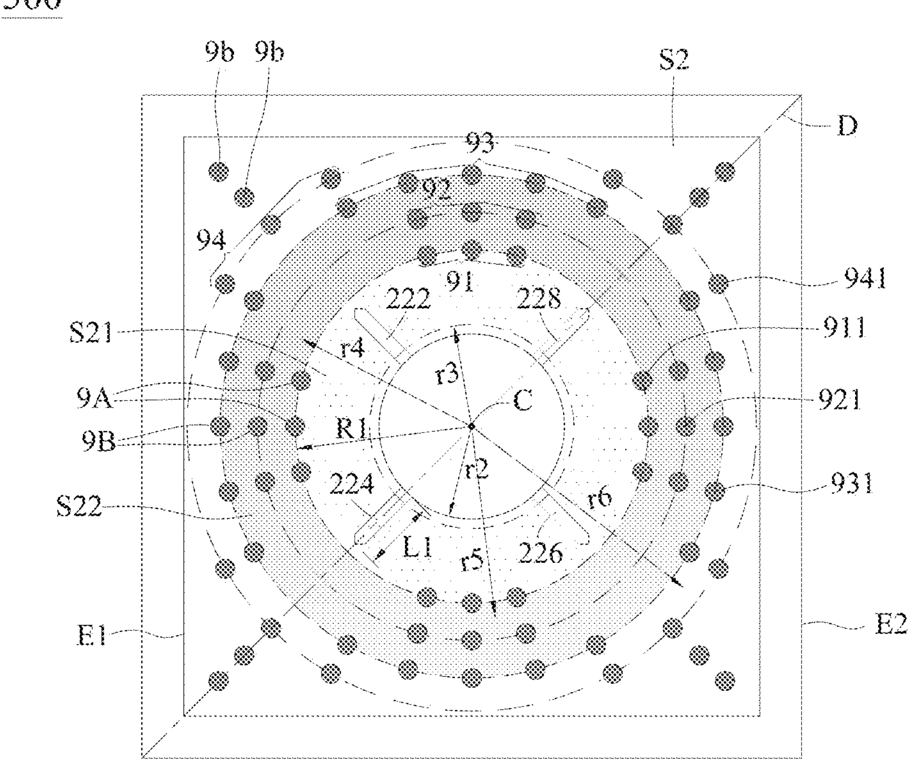
FIG. 7 shows a schematic top view of a semiconductor device in accordance with an embodiment of the present disclosure.

FIGS. 6 and 7 show schematic top views of semiconductor devices 400, 500 in accordance with an embodiment of the present disclosure. The semiconductor devices 400, 500 of these two embodiments are similar to the semiconductor device 100 shown in FIG. 1, and the difference is that in these two embodiments, the first group 91 of the contact regions 9 surrounds the electrode pad 21 and the extension electrodes 222, 224, 226, 228, that is, $L1+r2<R1$, wherein L1 is the extension length of the extension electrodes 222, 224, 226, 228, r2 is the radius of the electrode pad 21, R1 is the distance between the circle center of the first contact portion 911 and the geometric center C. In the embodiment shown in FIGS. 6 and 7, with the design of the first electrode 2, the extension length L1 is 1/1000 to 1/7 of the length D, such as 1/200~1/7, 1/15~1/10, or 1/150~1/100 of the length D, and each extension electrode 222, 224, 226, 228 has approximately the same extension length L1, for example. The density of the contact region 9 can gradually increase along a direction from the geometric center C of the epitaxial structure 1 toward the first edge E1 and the second edge E2, so that the current can be efficiently dispersed to each region to improve luminance.

The second surface S2 of the epitaxial structure 9 in this embodiment has a first region S21 and a second region S22 surrounding the first region S21, and the first region S21 is closer to the geometric center C than the second region S22. The first region S21 and the second region S22 in this embodiment are both ring-shaped and are connected to each other. The first region S21 is a ring-shaped structure with a distance of 0.15 L to 0.3 L from the geometric center, and the second region S22 is a ring-shaped structure with a distance of 0.3 L to 0.45 L from the geometric center. Specifically, an inner diameter r3 of the first region S21 is 0.15 times of the side length L, and an outer diameter r4 of the first region S21 is 0.3 times of the side length L, an inner diameter r5 of the second region S22 is 0.3 times of the side length L, and an outer diameter r6 is 0.45 times of the side length L, and the outer diameter r4 of the first region S21 is equal to the inner diameter r5 of the second region S22. The contact region 9 has a first part 9A (such as a plurality of first contact portions 911) located in the first region S21 and having a first density, and a second part 9B (such as a plurality of second contact portions 912 and a plurality of third contact portions 913) located in the second region S22 and having a second density greater than the first density. The first region S21 has a first area A21, the second region S22 has a second area A22, the total area of the first part 9A is A9A, and the total area of the second part 9B is A9B, then the first density is A9A/A21, the second density is A9B/A22. In this embodiment, the first density is 5% to 15%, the second density is 15% to 40%, the first area A21 is less than the second area A22, and the second area A22 is 1.02 to 5 times of the first area A21.

As shown in FIG. 1, the epitaxial structure 1 includes a first semiconductor structure 11, a second semiconductor structure 12, an active region 13 located between the first semiconductor structure 11 and the second semiconductor structure 12, a first confinement layer 14 located between the active region 13 and the first semiconductor structure 11, and a second confinement layer 15 located between the active region 13 and the second semiconductor structure 12. The first surface S1 of the epitaxial structure 1 is the surface of the second semiconductor structure 12, and the first electrode 2 is in direct contact with the second semiconductor structure 12. The first semiconductor structure 11 and the second semiconductor structure 12 may have different conductivity types. For example, the first semiconductor structure 11 is n-type and the second semiconductor structure 12 is p-type or the first semiconductor structure 11 is p-type and the second semiconductor structure 12 is n-type, whereby the first semiconductor structure 11 and the second semiconductor structure 12 can respectively provide electrons and holes or holes and electrons to combine in the active region 13 to emit light. The first semiconductor structure 11 has a first dopant, and the second semiconductor structure 12 has a second dopant, so that the first semiconductor structure 11 and the second semiconductor structure 12 have different conductivity types. The first dopant and the second dopant can be respectively carbon (C), zinc (Zn), silicon (Si), germanium (Ge), tin (Sn), selenium (Se), magnesium (Mg) or tellurium (Te). In this embodiment, the first semiconductor structure 11 is p-type, the second semiconductor structure 12 is n-type, and the first dopant in the first semiconductor structure 11 and the second dopant in the second semiconductor structure 12 are at a doping concentration of $5\times10^{17}$/cm3 to $1\times10^{20}/cm^3$. The energy gap of the first semiconductor structure 11 is larger than the that of the first confinement layer 14 and the energy gap of the second semiconductor structure 12 is larger than that of the second confinement layer 15, thereby carriers can be further confined in the active region 13.

The active region 13 is located between the first confinement layer 14 and the second confinement layer 15. In this embodiment, the active region 13 is directly connected with the first confinement layer 14, and the active region 13 is directly connected with the second confinement layer 15. In this embodiment, the active region 13 includes a plurality of well layers and barrier layers (not shown) alternately stacked. In the active region 13 of the semiconductor device 100 in this embodiment, the thickness of the well layer is less than the thickness of the barrier layer, and the well layer and/or the barrier layer may contain or may not contain a dopant.

The first semiconductor structure 11, the second semiconductor structure 12, the active region 13, the first confinement layer 14, and the second confinement layer 15 may respectively include a group III-V semiconductor material. The group III-V semiconductor material may include Al, Ga, As, P or In. In an embodiment, the first semiconductor structure 11, the second semiconductor structure 12, the active region 13, the first confinement layer 14 and the second confinement layer 15 do not include N. Specifically, the group III-V semiconductor material can be a binary compound semiconductor (such as GaAs or GaP), a ternary compound semiconductors (such as InGaAs, AlGaAs, InGaP or AlInP), or a quaternary compound semiconductors (such as AlGaInAs, AlGaInP, InGaAsP, InGaAsN or AlGaAsP). In an embodiment, the active region 13 substantially composed of a ternary compound semiconductor (such as InGaAs, AlGaAs, InGaP, or AlInP) or a quaternary compound semiconductor (such as AlGaInAs, AlGaInP, InGaAsP, or AlGaAsP).

The semiconductor devices 100, 200, 300, 400 and 500 may include a double heterostructure (DH), a double-side double heterostructure (DDH) or a multiple quantum well (MQW) structure. According to an embodiment, when the semiconductor devices 100, 200, 300, 400, and 500 are light-emitting devices, the active region 13 can emit a light, and the light includes visible or invisible light. With the reflective structure 5, most of the light emitted from the active region 13 is emitted out of the semiconductor device 100 through the first surface S1. The wavelength of light emitted by the semiconductor device 100 is determined by the material of the active region 13. The material of the active region 13 may include InGaAs, AlGaAsP, GaAsP, InGaAsP, AlGaAs, AlGaInAs, InGaP or AlGaInP. For example, the active region 13 can emit an infrared light with a peak wavelength of 700 to 1700 nm, a red light with a peak wavelength of 610 nm to 700 nm, or a yellow light with a peak wavelength of 530 nm to 600 nm. In this embodiment, the active region 13 emits an infrared light with a peak wavelength of 730 nm to 1600 nm.

The base 7 contains conductive or insulating materials. The conductive materials may include gallium arsenide (GaAs), indium phosphide (InP), silicon carbide (SiC), gallium phosphide (GaP), zinc oxide (ZnO), gallium nitride (GaN), aluminum nitride (AlN), germanium (Ge) or silicon (Si). The insulating material may include sapphire. In other embodiments, the base 7 is a growth substrate, that is, the epitaxial structure 1 can be formed on the base 7 by an epitaxial method such as metal-organic chemical vapor deposition (MOCVD). In an embodiment, the base 7 is a bonding substrate instead of a growth substrate, and the base 7 can be bonded to the epitaxial structure 1 through the bonding structure 6, as shown in FIG. 1.

The first electrode 2 and the second electrode 3 are used for electrical connection with an external power source. The materials of the first electrode 2 and the second electrode 3 may be the same or different. For example, the materials of the first electrode 110 and the second electrode 112 may include a metal oxide, a metal or an alloy. The metal oxide may include indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO) or indium zinc oxide (IZO). The metal may include germanium (Ge), beryllium (Be), zinc (Zn), gold (Au), platinum (Pt), titanium (Ti), aluminum (Al), nickel (Ni), or copper (Cu). The alloy may include two or more of the above metals, such as germanium gold nickel (GeAuNi), beryllium gold (BeAu), germanium gold (GeAu) or zinc gold (ZnAu).

The insulating portion 8 includes an insulating material such as silicon nitride ($SiN_x$), aluminum oxide ($AlO_x$), silicon oxide ($SiO_x$), magnesium fluoride ($MgF_x$), titanium oxide ($TiO_2$), niobium oxide ($Nb_2O_5$) or a combination thereof. In an embodiment, the insulating portion 8 may be chosen to be an insulating material with a refractive index less than or equal to 2. In an embodiment, the insulating portion 8 may also include a first Distributed Bragg Reflector (DBR) structure, which can be formed by alternately stacking two or more of the above insulating materials.

In this embodiment, the contact region 9 is defined by the insulating portion 8. As shown in FIG. 1, the insulating portion 8 has a plurality of openings **8*a* which is separated from each other, the conductive layer 4 can contact the plurality of insulating portions 8 and fill the openings 8*a*, the conductive layer 4 and the epitaxial structure 1 form the contact region 9 at the openings 8*a*, thereby the conductive layer 4 and the epitaxial structure 1 are electrically connected. The conductive layer 4 may include metal, metal oxide, semiconductor material, or the like. For example, the metal includes gold (Au), silver (Ag), copper (Cu), aluminum (Al), tin (Sn), indium (In), or an alloy of two or more metal elements thereof. For example, the metal oxide includes indium tin oxide (ITO), indium oxide (InO), tin oxide (SnO), cadmium tin oxide (CTO), antimony tin oxide (ATO), aluminum zinc oxide (AZO), zinc tin oxide (ZTO), gallium zinc oxide (GZO), indium tungsten oxide (IWO), zinc oxide (ZnO), indium zinc oxide (IZO), or a combination thereof. The semiconductor material is, for example, GaP, GaAs, InP, InGaInAs, InGaAs, AlGaAs, AlInP, or the like. In other embodiments, the contact region 9 can also be independent from the insulating portion 8. For example, the contact region 9 includes a plurality of contact members which is separated from each other on the semiconductor structure 1 and protrudes from the semiconductor structure 1, the conductive layer 4 contacts the contact region 9 and the insulating portion 8 at the same time. For the material of the contact region 9, the material of the conductive layer 4 (such as metal, metal oxide, or semiconductor material) can be referred to, and the contact region 9 and the conductive layer 4** have different materials.

The reflective structure 5 can reflect the light emitted from the active region 13 towards the second semiconductor structure 12 to exit the semiconductor device 100. The reflective structure 5 may include semiconductor material, metal or alloy. The semiconductor material may include a group III-V semiconductor material, such as a binary, ternary, or quaternary group III-V semiconductor material. The metal may include, but are not limited to, copper (Cu), aluminum (Al), tin (Sn), gold (Au), silver (Ag), or the like. The alloy may include two or more of the above metals. In an embodiment, the reflective structure 5 may include a second Distributed Bragg Reflector (DBR) structure. The second DBR structure can be formed by alternately stacking two or more semiconductor materials with different refractive indices, such as AlAs/GaAs, AlGaAs/GaAs or InGaP/GaAs.

The bonding structure 6 connects the base 7 and the reflective structure 5. In an embodiment, the bonding structure 6 may be a single layer or multiple layers (not shown). The material of the bonding structure 6 may include conductive material, metal or alloy. The conductive material includes, but are not limited to, indium tin oxide (ITO), indium oxide (InO), tin oxide (SnO), cadmium tin oxide (CTO), antimony tin oxide (ATO), aluminum zinc oxide (AZO), zinc tin oxide (ZTO), Gallium Zinc Oxide (GZO), Zinc Oxide (ZnO), Gallium Phosphide (GaP), Indium Cerium Oxide (ICO), Indium Tungsten Oxide (IWO), Indium Titanium Oxide (ITiO), Indium Zinc Oxide (IZO), indium gallium oxide (IGO), gallium aluminum zinc oxide (GAZO), graphene or a combination of the above materials. The metal includes but are not limited to indium (In), copper (Cu), aluminum (Al), tin (Sn), gold (Au), silver (Ag), titanium (Ti), nickel (Ni), platinum (Pt) or Tungsten (W). The alloy may include two or more of the above metals.

Figure 8:
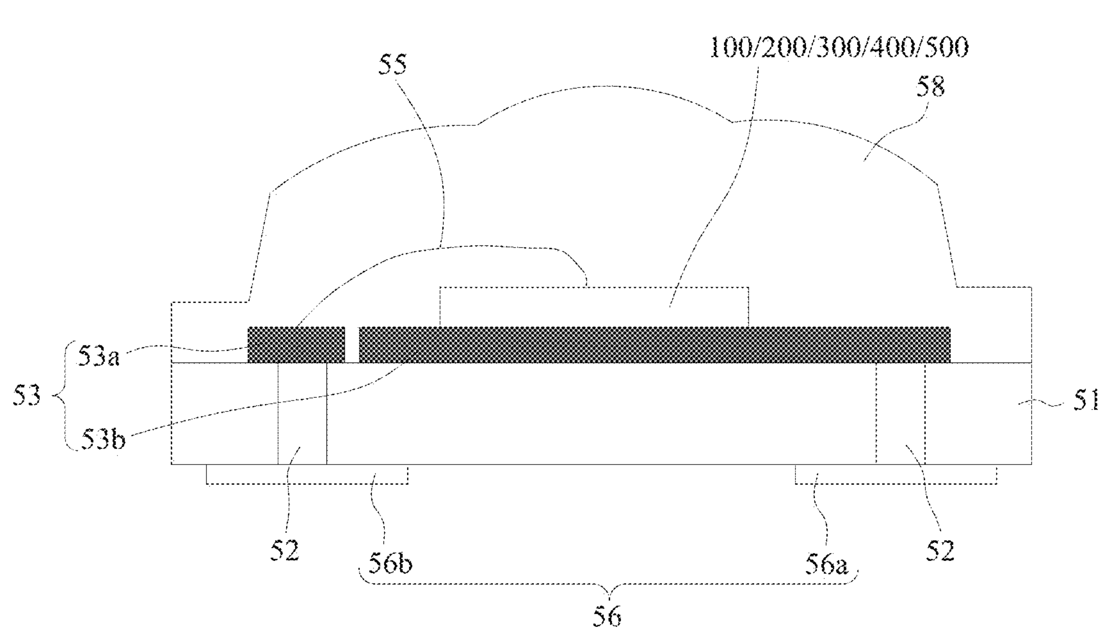
FIG. 8 shows a schematic sectional view of a semiconductor package structure in accordance with an embodiment of the present disclosure.

FIG. 8 shows a schematic sectional view of a semiconductor package structure 600 in accordance with an embodiment of the present disclosure. Referring to FIG. 8, the semiconductor package structure 600 includes a semiconductor device 100, 200, 300, 400 or 500, a package substrate 51, a carrier 53, a bonding wire 55, a contact structure 56 and an encapsulating material 58. The package substrate 51 may include a ceramic or glass. The package substrate 51 has a plurality of through holes 52. Each through hole 52 may be filled with a conductive material such as metal for electrical conduction and/or heat dissipation. The carrier 53 may be located on a surface of one side of the package substrate 51 and may contain a conductive material such as metal. The contact structure 56 is on a surface on another side of the package substrate 51. In the embodiment, the contact structure 56 includes a first contact pad 56*a* and a second contact pad 56*b*, and the first contact pad 56*a* and the second contact pad 56*b* can be electrically connected to the carrier 53 through the through holes 52. In an embodiment, the contact structure 56 may further include a thermal pad (not shown), for example, between the first contact pad 56*a* and the second contact pad 56*b*.

The semiconductor device 100/200/300/400/500 is located on the carrier 53. In the embodiment, the carrier 53 includes a first part 53*a* and a second portion 53*b*, and the semiconductor device 100/200/300/400/500 is electrically connected to the second portion 53*b* of the carrier 53 by a bonding wire 55. The material of the bonding wire 55 may include metal, such as gold (Au), silver (Ag), copper (Cu), or aluminum (Al), or may include alloy containing one or more of the above metals. The encapsulating material 58 covers the semiconductor device 100/200/300/400/500 and protects the semiconductor device 100/200/300/400/500. Specifically, the encapsulating material 58 may include a resin material, such as an epoxy resin, or a silicone resin. The encapsulating material 58 may further include a plurality of wavelength conversion particles (not shown) to convert a first light emitted by the semiconductor device 100/200/300/400/500 into a second light. The wavelength of the second light is greater than the wavelength of the first light.

Figure 9:
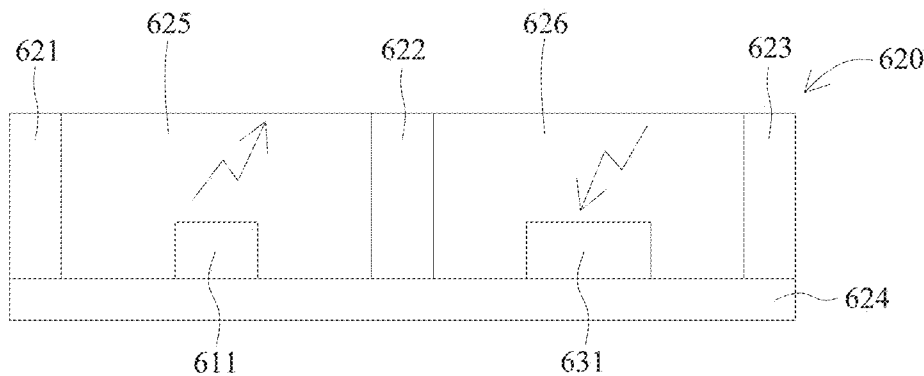
FIG. 9 shows a partial schematic sectional view of a semiconductor package structure in accordance with an embodiment of the present disclosure.

FIG. 9 shows a partial schematic sectional view of a semiconductor package structure 700 in accordance with an embodiment of the present disclosure. The semiconductor package structure 700 includes a support 620, a first semiconductor component 611 and a second semiconductor component 631. The first semiconductor component 611 and/or the second semiconductor component 631 may include the above-mentioned semiconductor devices 100/200/300/400/500. The support 620 includes a first blocking wall 621, a second blocking wall 622, a third blocking wall 623, a carrier board 624, a first space 625 and a second space 626. The first semiconductor component 611 is located in the space 625 between the first blocking wall 621 and the second blocking walls 622, the second semiconductor component 631 is located in the space 626 between the second blocking wall 622 and the third blocking wall 623. The first semiconductor component 611 and/or the second semiconductor component 631 may be a vertical-type chip as shown in FIG. 1. The first semiconductor component 611 and the second semiconductor component 631 are located on the carrier board 624 and are electrically connected to a circuit connection structure (not shown) on the carrier board 624. In this embodiment, the first semiconductor component 611 is a light-emitting device, the second semiconductor component 631 is a light-receiving device, and the semiconductor package structure 700 can be placed in a mobile device (such as a mobile phone or a laptop) or a wearable device (such as a watch or a headphone). The operation mode is, for example, the light emitted from the first semiconductor component 611 passes through skin and irradiates cells and blood inside a human body, and then the second semiconductor device 631 absorbs the light scattered/reflected from the cells and blood. Based on changes of the scattered/reflected light, characteristics or physiological signals of the human body, such as fingerprints, face, heart rate, blood sugar, blood pressure, blood oxygen concentration can be detected.

Specifically, the epitaxial structure, the semiconductor device and the semiconductor package structure of the present disclosure may be applied to products in various fields, such as illumination, medical care, display, communication, sensing, or power supply system, for example, can be used in a light fixture, monitor, mobile phone, tablet, an automotive instrument panel, a television, computer, wearable device (such as watch, bracelet or necklace), traffic sign, outdoor display, or medical device.

It should be realized that each of the embodiments mentioned in the present disclosure is used for describing the present disclosure, but not for limiting the scope of the present disclosure. Any obvious modification or alteration is not departing from the spirit and scope of the present disclosure. Furthermore, embodiments can be combined or substituted under proper condition and are not limited to specific embodiments described above. A connection relationship between a specific component and another component specifically described in an embodiment can also be applied in another embodiment and is within the scope as claimed in the present disclosure.

What is claimed is:

1. A semiconductor device, having a first diagonal line, a second diagonal line, a first edge and a second edge connected to the first edge, comprising:

an epitaxial structure comprising a geometric center, a first surface and a second surface opposite to the first surface;

an electrode pad on the first surface; and a contact region on the second surface and comprising a first group, a second group, and a third group; wherein the first group comprises a plurality of first contact portions separated from each other and is arranged in a first ring shape about the geometric center, the second group comprises a plurality of second contact portions separated from each other and is arranged in a second ring shape about the geometric center, and the third group comprises a third contact portion, wherein each of the first contact portions is separated from the geometric center by a first distance, each of the second contact portions is separated from the geometric center by a second distance, and the third contact portion is separated from the geometric center by a third distance, the third distance is greater than the second distance, and the second distances between each of the plurality of second contact portions and the geometric center is greater than a first distance between each of the plurality of first contact portions and the geometric center;

wherein in a top view, the plurality of first contact portions and the plurality of second contact portions are disposed between the first diagonal line and the second diagonal line, and the third contact portion is disposed along the first diagonal line or the second diagonal line; and wherein the semiconductor device comprises a plurality of radial lines devoid of being parallel to the first edge or the second edge, the plurality of radial lines comprises a first radial line and a second radial line, the first radial line passes though the geometric center, one of the plurality of first contact portions and one of the plurality of second contact portions, and the second radial line passes though the geometric center, another one of the plurality of first contact portions and another one of the plurality of second contact portions.

2. The semiconductor device of claim 1, wherein the contact region further comprises a fourth group comprising a plurality of fourth contact portions separated from each other and is arranged in a fourth ring shape, and a fourth distance between each of the fourth contact portions and the geometric center is greater than the second distance.

3. The semiconductor device of claim 2, wherein the one of plurality of the first contact portions is adjacent to the one of the plurality of second contact portions and is separated from the one of the plurality of second contact portions by a first pitch, one of the plurality of fourth contact portions is adjacent to the one of the plurality of second contact portions and is separated from the one of the plurality of second contact portions by a second pitch, and the second pitch is equal to or greater than the first pitch.

4. The semiconductor device of claim 2, wherein the first radial line passes through one of the plurality of fourth contact portions, and the second radial line passes through another one of the plurality of fourth contact portions.

5. The semiconductor device of claim 2, wherein each of the plurality of first contact portions has a first width and each of the plurality of second contact portions has a second width greater than or less than the first width.

6. The semiconductor device of claim 1, wherein the number of the plurality of second contact portions is larger than the number of the plurality of first contact portions.

7. The semiconductor device of claim 1, further comprising an extension electrode on the first surface, wherein the extension electrode is connected to the electrode pad and extends along the first diagonal line or the second diagonal line.

8. The semiconductor device of claim 7, wherein the one of the first diagonal line or the second diagonal line has a first length, and the extension electrode has an extension length less than a quarter of the first length.

9. The semiconductor device of claim 7, wherein the contact region further comprises a plurality of outer contact portions separately arranged along the first diagonal line or the second diagonal line, and the extension electrode is between the plurality of outer contact portions.

10. The semiconductor device of claim 1, wherein the plurality of first contact portions in the first group has different widths.

11. The semiconductor device of claim 1, wherein the one of the plurality first contact portions comprises a first circle center, the one of the plurality of second contact portions comprises a second circle center, the another one of the plurality of first contact portions comprises a third circle center, and the another one of the plurality of second contact portions comprises a fourth circle center, and wherein the first radial line passes through the first circle center and the second circle center, and the second radial line passes through the third circle center and the fourth circle center.

12. A semiconductor device, comprising:

an epitaxial structure comprising a geometric center, a first surface and a second surface opposite to the first surface, the second surface has a first region and a second region which surrounds the first region;

an electrode pad on the first surface; and a contact region comprising a first part on the first region and a second part on the second region;

wherein the first region is closer to the geometric center than the second region, the first part has a first density, and the second part has a second density less than the first density;

wherein the first density is based on an area of the first region and an area of the first part and the second density is based on an area of the second region and an area of the second part; and wherein the epitaxial structure has a side length of L, the first region is a ring-shaped structure with a distance of 0.15L to 0.3L from the geometric center.

13. The semiconductor device of claim 12, wherein the first region, the second region or both have a ring shape.

14. The semiconductor device of claim 12, wherein the first region is not overlapped with the electrode pad.

15. The semiconductor device of claim 12, wherein the area of the second region is greater than the area of the first region.

16. The semiconductor device of claim 15, wherein the area of the second area is 1.02 times to 2 times of the area of the first area.

17. The semiconductor device of claim 12, wherein the second region is a ring-shaped structure with a distance of 0.3L to 0.45L from the geometric center.

18. The semiconductor device of claim 12, further comprising an extension electrode on the first surface and connecting to the electrode pad.

19. The semiconductor device of claim 18, wherein the semiconductor device comprises a diagonal line having a first length, and the extension electrode has an extension length less than a quarter of the first length.

20. The semiconductor device of claim 12, wherein the second surface has a first surface area, and a side of the contact region facing the second surface has a second surface area, and the percentage ratio of the second surface area to the first surface area is 0.5% to 25%.

* * * * *